United States Patent
Iwaki et al.

(10) Patent No.: US 9,148,119 B2
(45) Date of Patent: Sep. 29, 2015

(54) FILTER AND DUPLEXER

(71) Applicant: TAIYO YUDEN CO., LTD., Tokyo (JP)

(72) Inventors: Masafumi Iwaki, Tokyo (JP); Shogo Inoue, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 311 days.

(21) Appl. No.: 13/662,973

(22) Filed: Oct. 29, 2012

(65) Prior Publication Data

US 2013/0127566 A1 May 23, 2013

(30) Foreign Application Priority Data

Nov. 21, 2011 (JP) .................................. 2011-254202

(51) Int. Cl.
*H03H 9/54* (2006.01)
*H03H 9/64* (2006.01)
*H03H 9/145* (2006.01)
*H03H 9/70* (2006.01)
*H03H 9/72* (2006.01)

(52) U.S. Cl.
CPC ........... *H03H 9/14594* (2013.01); *H03H 9/542* (2013.01); *H03H 9/6436* (2013.01); *H03H 9/6483* (2013.01); *H03H 9/706* (2013.01); *H03H 9/725* (2013.01)

(58) Field of Classification Search
CPC ....... H03H 9/542; H03H 9/703; H03H 9/706; H03H 9/72; H03H 9/725; H03H 9/6483
USPC .......................................... 333/133, 193, 195
See application file for complete search history.

(56) References Cited

U.S. PATENT DOCUMENTS

| | | | | |
|---|---|---|---|---|
| 5,486,800 A * | 1/1996 | Davenport | .................... | 333/193 |
| 6,909,338 B2 * | 6/2005 | Omote | ......................... | 333/133 |
| 7,034,638 B2 * | 4/2006 | Yamamoto et al. | ........... | 333/193 |
| 7,414,494 B2 * | 8/2008 | Nakazawa et al. | ............ | 333/133 |
| 8,912,971 B2 * | 12/2014 | Iwaki et al. | .................... | 343/850 |
| 9,065,419 B2 * | 6/2015 | Hara et al. | ............................ | 1/1 |
| 2011/0090026 A1 * | 4/2011 | Nakahashi et al. | ........... | 333/195 |

FOREIGN PATENT DOCUMENTS

| | | | |
|---|---|---|---|
| JP | 06061783 A | * | 3/1994 |
| JP | 9-167937 A | | 6/1997 |
| JP | 2001-230657 A | | 8/2001 |
| JP | 2003-69382 A | | 3/2003 |

* cited by examiner

*Primary Examiner* — Dean Takaoka
*Assistant Examiner* — Alan Wong
(74) *Attorney, Agent, or Firm* — Chen Yoshimura LLP

(57) ABSTRACT

A filter includes: first series resonators and first parallel resonators that are connected in a ladder shape between an input terminal and an output terminal; a first inductor that is connected in parallel to at least one first series resonator; one or more second parallel resonators that are provided separately from the first parallel resonators, are connected between the input terminal and the output terminal, and have a resonance frequency and an anti-resonance frequency at frequencies lower than a passband formed by the first series resonators and the first parallel resonators; wherein an attenuation region is formed by a first attenuation pole formed by the at least one first series resonator and the first inductor and a second attenuation pole formed by a resonant response of the one or more second parallel resonators.

18 Claims, 24 Drawing Sheets

_US 9,148,119 B2_

FILTER AND DUPLEXER

CROSS-REFERENCE TO RELATED APPLICATION

This application is based upon and claims the benefit of priority of the prior Japanese Patent Application No. 2011-254202, filed on Nov. 21, 2011, the entire contents of which are incorporated herein by reference.

FIELD

A certain aspect of the present invention relates to a filter and a duplexer.

BACKGROUND

Filters using acoustic wave resonators are used in wireless devices for example. Exemplary acoustic wave resonators are a surface acoustic wave resonator and a piezoelectric film resonator. A ladder-type filter using the acoustic wave resonator functions as a bandpass filter. An inductor may be connected in parallel to a series resonator in order to suppress a specific frequency band other than a passband in the ladder-type filter as disclosed in Japanese Patent Application Publication Nos. 9-167937 (Patent Document 1) and 2003-69382 (Patent Document 2) for example.

However, gentle attenuation characteristic is obtained when the methods disclosed in Patent Documents 1 and 2 are used. Thus, it is difficult to secure a certain amount of attenuation in a specific frequency band.

SUMMARY OF THE INVENTION

According to an aspect of the present invention, there is provided a filter including: first series resonators and first parallel resonators that are connected in a ladder shape between an input terminal and an output terminal; a first inductor that is connected in parallel to at least one first series resonator; one or more second parallel resonators that are provided separately from the first parallel resonators, are connected between the input terminal and the output terminal, and have a resonance frequency and an anti-resonance frequency at frequencies lower than a passband formed by the first series resonators and the first parallel resonators; wherein an attenuation region is formed by a first attenuation pole formed by the at least one first series resonator and the first inductor and a second attenuation pole formed by a resonant response of the one or more second parallel resonators.

According to another aspect of the present invention, there is provided a duplexer including: the above described filter.

DETAILED DESCRIPTION

Figure 1A:
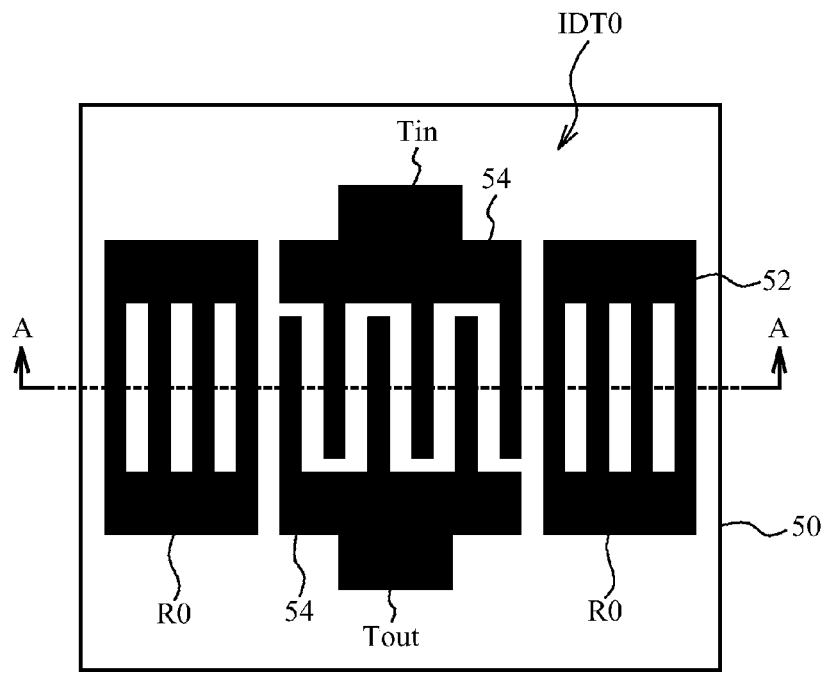
FIG. 1A is a plain view illustrating a surface acoustic wave resonator.
Figure 1B:
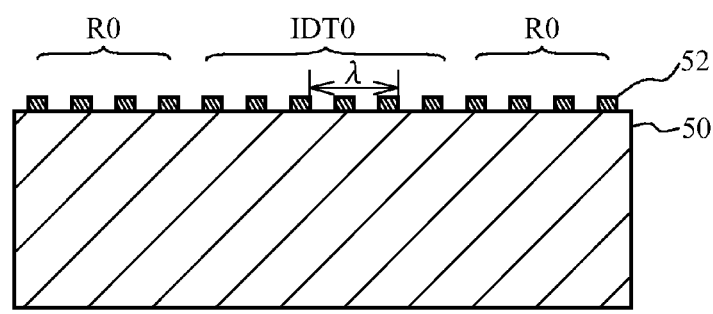
FIG. 1B is a cross-sectional view taken along line A-A in FIG. 1A.

A description will now be given of an exemplary acoustic wave resonator used in embodiments hereinafter. FIG. 1A is a plain view illustrating a surface acoustic wave resonator, and FIG. 1B is a cross-sectional view taken along line A-A in FIG. 1A. As illustrated in FIG. 1A and FIG. 1B, a metal film 52 such as aluminum or copper is formed on a piezoelectric substrate 50 such as lithium tantalate (LT) or lithium niobate (LN). The metal film 52 forms reflectors R0, an IDT (Interdigital Transducer) IDT0, an input terminal Tin, and an output terminal Tout. The IDT includes two comb-shaped electrodes 54. The input terminal Tin is connected to one of the comb-shaped electrodes 54, and the output terminal Tout is connected to the other one of the comb-shaped electrodes 54. The input terminal Tin and the output terminal Tout are pads for example. The reflectors R0 are arranged at both sides of the IDT0 in a propagation direction of acoustic waves. The comb-shaped electrodes 54 and the reflectors R0 include electrode fingers arranged at an interval corresponding to a wavelength $\lambda$ of the acoustic wave. Acoustic waves excited by the IDT0 are reflected by the reflectors R0. Thus, the surface acoustic wave resonator resonates at a frequency corresponding to the wavelength $\lambda$ of the acoustic wave.

Figure 2A:
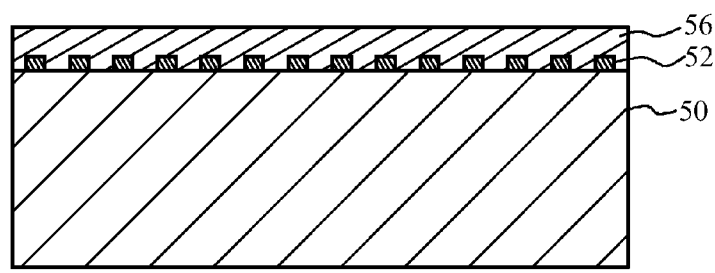
FIG. 2A is a cross-sectional view of a Love wave resonator.
Figure 2B:
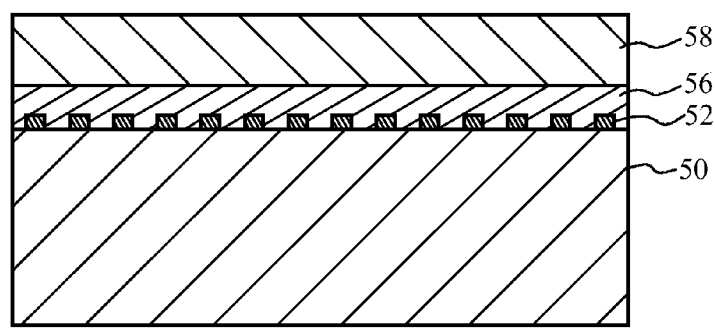
FIG. 2B is a cross-sectional view of a boundary acoustic wave resonator.

FIG. 2A is a cross-sectional view of a Love wave resonator, and FIG. 2B is a cross-sectional view of a boundary acoustic wave resonator. Plain views of the Love wave resonator and the boundary acoustic wave resonator are the same as FIG. 2A, and a description will be omitted. As illustrated in FIG. 2A, a dielectric film 56 is formed so as to cover the metal film 52 in the Love wave resonator. A silicon oxide film may be used for the dielectric film 56 for example. As illustrated in FIG. 2B, the dielectric film 56 is formed so as to cover the metal film 52 in the boundary acoustic wave resonator. Furthermore, a dielectric film 58 is formed on the dielectric film 56. The dielectric film 58 is an aluminum oxide film for example. An acoustic velocity of the dielectric film 58 is preferably faster than that of the dielectric film 56 in order to confine the acoustic wave to the dielectric film 56. The Love wave resonator and the boundary acoustic wave resonator are a type of surface acoustic wave resonator.

Figure 3A:
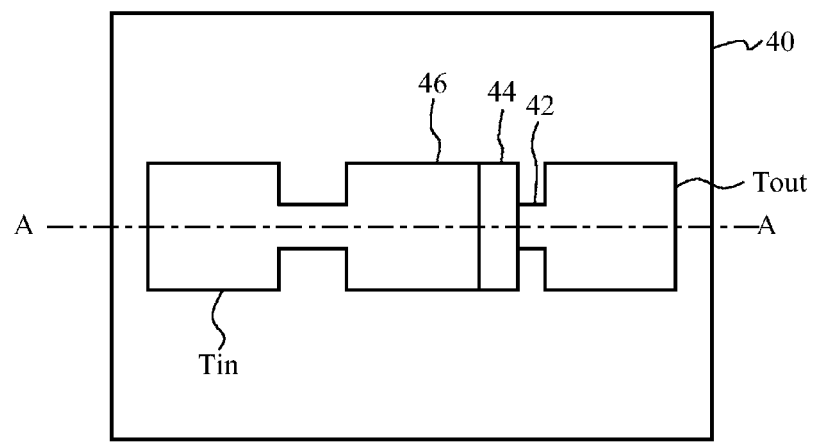
FIG. 3A is a plain view illustrating a piezoelectric thin film resonator.
Figure 3B:
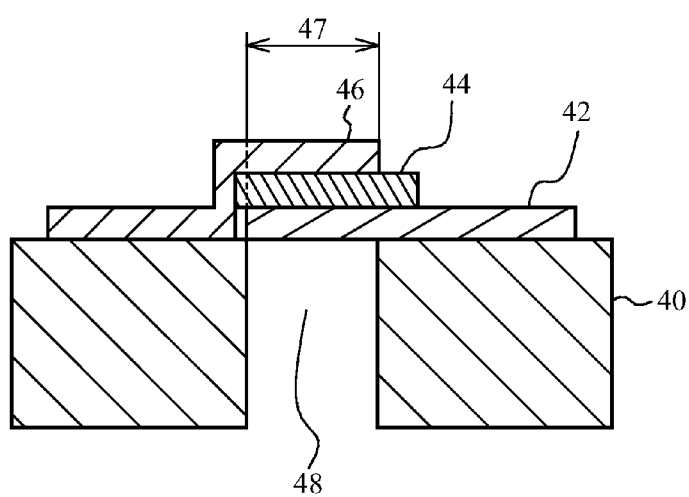
FIG. 3B is a cross-sectional view taken along line A-A in FIG. 3A.

FIG. 3A is a plain view illustrating a piezoelectric thin film resonator, and FIG. 3B is a cross-sectional view taken along line A-A in FIG. 3A. As illustrated in FIG. 3A and FIG. 3B, on a substrate 40 such as silicon, stacked are a lower electrode 42, a piezoelectric film 44 such as aluminum nitride, and an upper electrode 46 in this order from the substrate 40 side. A resonance region 47 is a region in which the upper electrode 46 and the lower electrode 42 overlap each other across the piezoelectric film 44. In the resonance region 47, the acoustic wave propagated to a vertical direction resonates and fulfills the function as a resonator. A space 48 is formed in the substrate 40 below the resonance region 47. The space 48 may be formed between the substrate 40 and the lower electrode 42. An acoustic multilayered film that reflects the acoustic wave may be formed instead of the space 48.

Figure 4:
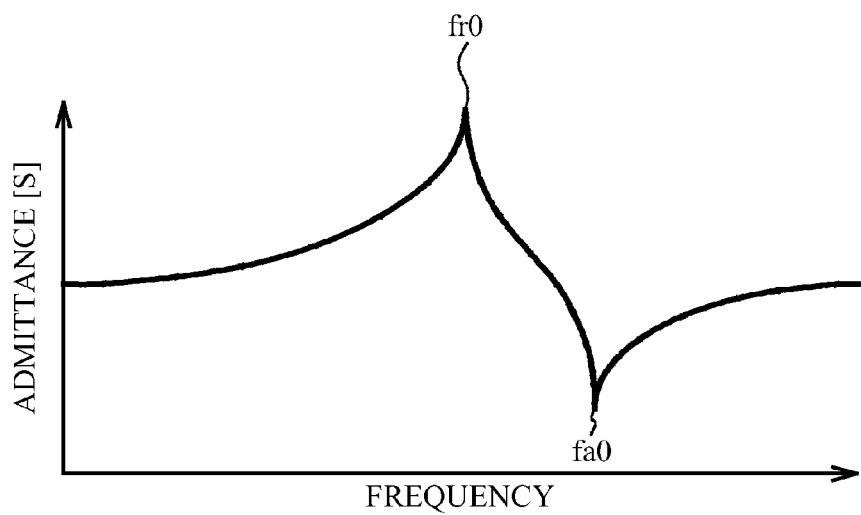
FIG. 4 is a schematic view illustrating an admittance characteristic of the acoustic wave resonator.

FIG. 4 is a schematic view illustrating an admittance characteristic of the acoustic wave resonator. As illustrated in FIG. 4, the acoustic wave resonator has a double resonance characteristic having a primary resonance frequency fr0 and a primary anti-resonance frequency fa0. The primary anti-resonance frequency fa0 is formed at a frequency higher than and close to the primary resonance frequency fr0.

Figure 5A:
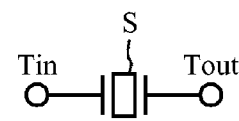
FIG. 5A is a circuit diagram of a series resonator S.
Figure 5B:
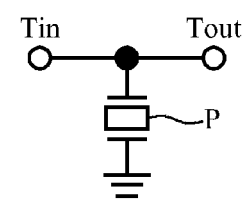
FIG. 5B is a circuit diagram of a parallel resonator P.
Figure 5C:
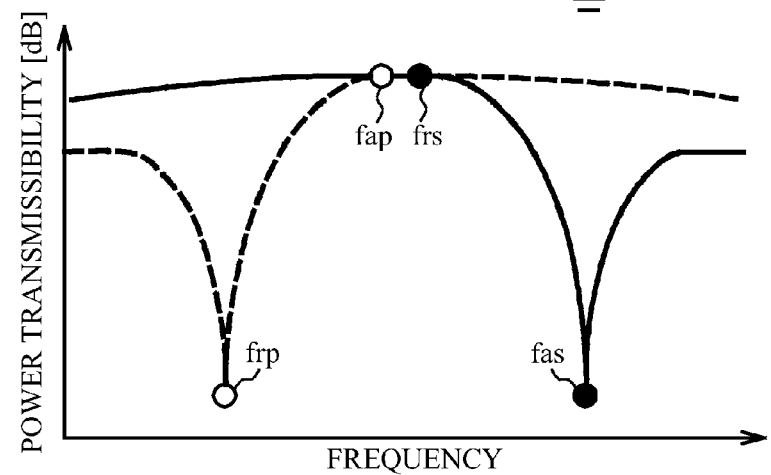
FIG. 5C is a schematic view illustrating pass characteristics of the series resonator and the parallel resonator.

FIG. 5A is a circuit diagram of a series resonator S, FIG. 5B is a circuit diagram of a parallel resonator P, and FIG. 5C is a schematic view of pass characteristics of the series resonator and the parallel resonator. As illustrated in FIG. 5A, an acoustic wave resonator having the admittance characteristic illustrated in FIG. 4 is connected in series between the input terminal Tin and the output terminal Tout to form the series resonator S. As illustrated in FIG. 5B, the acoustic wave resonator having the admittance characteristic illustrated in FIG. 4 is connected in parallel between the input terminal Tin and the output terminal Tout to form the parallel resonator P.

A solid line indicates a pass characteristic of the series resonator S, and a dashed line indicates a pass characteristic of the parallel resonator P in FIG. 5C. As illustrated in FIG. 5C, the series resonator S functions as a low-pass filter having transition frequencies between a resonance frequency frs and an anti-resonance frequency fas. The parallel resonator P functions as a high-pass filter having transition frequencies between a resonance frequency frp and an anti-resonance frequency fap. It is designed to set the resonance frequency frs of the series resonator S and the anti-resonance frequency fap of the parallel resonator P approximately equal to each other. A bandpass filter may be configured by connecting the series resonator S to the parallel resonator P to form a single-stage ladder-type filter.

Figure 6A:
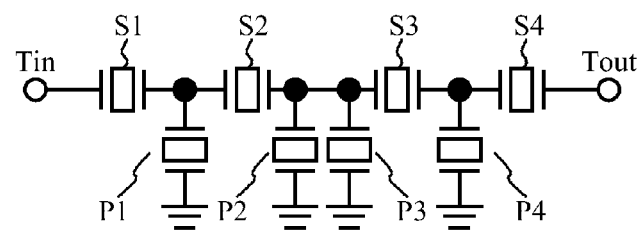
FIG. 6A is a circuit diagram of a multi-stage ladder-type filter.
Figure 6B:
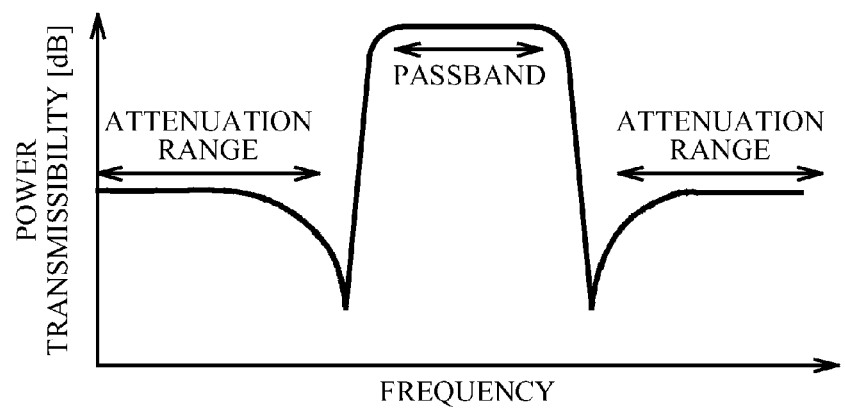
FIG. 6B is a schematic view illustrating a pass characteristic of the ladder-type filter.

FIG. 6A is a circuit diagram of a multi-stage ladder-type filter, and FIG. 6B is a schematic view illustrating a pass characteristic of this filter. As illustrated in FIG. 6A, the ladder-type filter includes series resonators S1 through S4 and parallel resonators P1 through P4. The series resonators S1 through S4 and the parallel resonators P1 through P4 are connected in a ladder shape. For example, the series resonators S1 through S4 are connected in series between the input terminal Tin and the output terminal Tout. The parallel resonators P1 through P4 are connected in parallel between the input terminal Tin and the output terminal Tout. As illustrated in FIG. 6B, a passband is formed by the series resonators S1 through S4 and the parallel resonators P1 through P4. Attenuation ranges are formed at both sides of the passband. As described above, the multi-stage ladder-type filter forms a bandpass filter achieving a higher degree of suppression.

Figure 7:
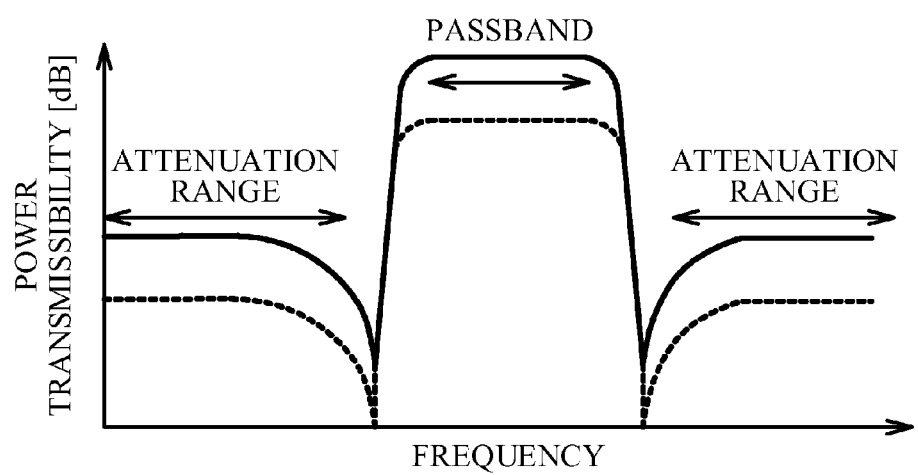
FIG. 7 is a schematic view illustrating pass characteristics of two types of ladder-type filters.

FIG. 7 is a schematic view illustrating pass characteristics of two types of ladder-type filters. Referring to FIG. 7, power transmissibility in an attenuation range of the ladder-type filter is relatively flat. Thus, as indicated with a dashed line, when a degree of suppression in the attenuation range is set to be high, the degree of suppression becomes high over the entire range. Therefore, insertion loss in the passband becomes large.

Figure 8A:
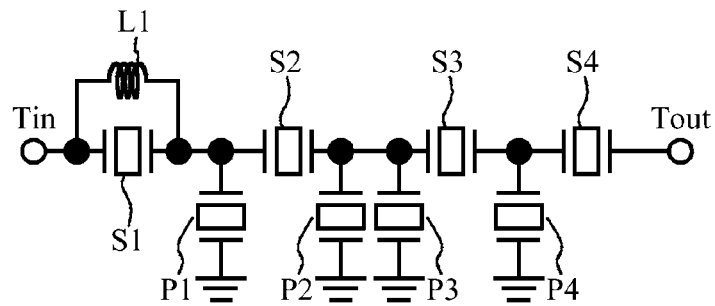
FIG. 8A is a circuit diagram of a ladder-type filter in accordance with a first comparative example.
Figure 8B:
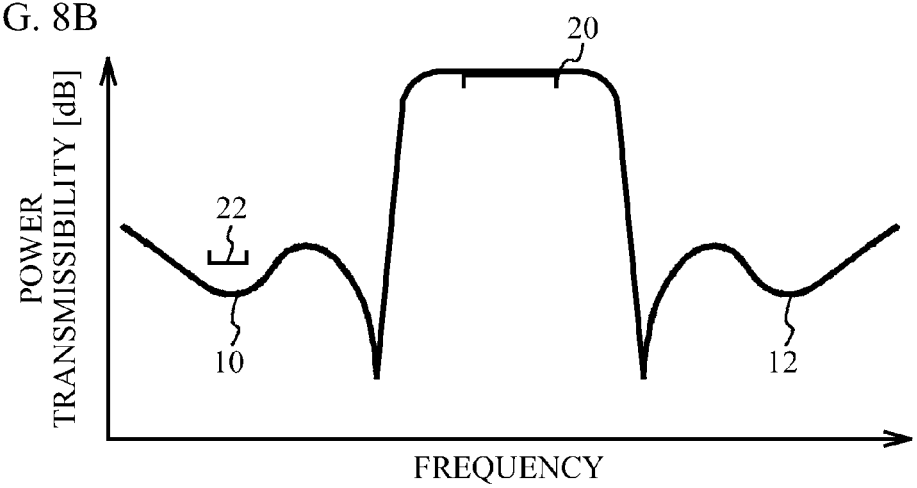
FIG. 8B is a schematic view illustrating a pass characteristic of the ladder-type filter of the first comparative example.

FIG. 8A is a circuit diagram of a ladder-type filter in accordance with a first comparative example, and FIG. 8B is a schematic view illustrating a pass characteristic of the ladder-type filter of the first comparative example. As illustrated in FIG. 8A, an inductor L1 is connected in parallel to the series resonator S1. It is sufficient if the inductor L1 is connected in parallel to at least one of the series resonators S1 through S4. As illustrated in FIG. 8B, when the inductor L1 is electrically connected in parallel to the series resonator S1, the insertion loss in the passband is not largely changed, an attenuation pole 10 is formed in the attenuation range at a frequency lower than the passband, and an attenuation pole 12 is formed in the attenuation range at a frequency higher than the passband. A specification 20 denotes an insertion loss specification in the passband, and a specification 22 denotes an attenuation specification in FIG. 8B, for example. Respective widths of the specification 20 and the specification 22 represent a band, and a horizontal line represents a standard of insertion loss or a standard of attenuation. The specification 22 is the attenuation specification for frequency bands of other communication methods, for example. The specification 22 is satisfied by providing the attenuation pole 10, but an attenuation characteristic of the attenuation pole 10 is gentle, and thus does not have a margin against the specification 22. Depending on the specification 22, the specification 22 may not be satisfied by only providing the attenuation pole 10. Hereinafter, a description will be given of embodiments of a filter having a sufficient attenuation characteristic against the specification 22.

First Embodiment

Figure 9A:
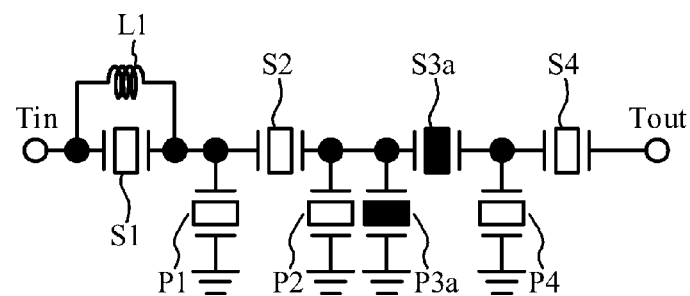
FIG. 9A is a circuit diagram of a filter in accordance with a first embodiment.
Figure 9B:
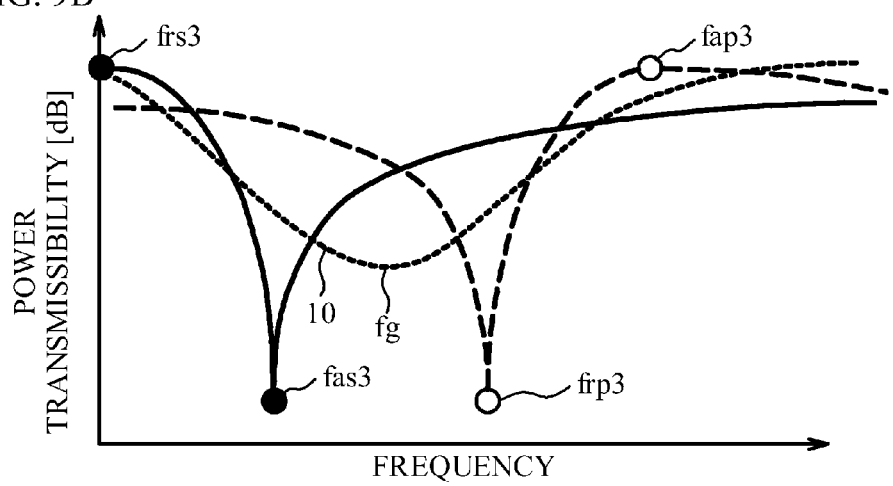
FIG. 9B is a schematic view illustrating an attenuation characteristic around an attenuation pole.

FIG. 9A is a circuit diagram of a filter in accordance with a first embodiment, and FIG. 9B is a schematic view illustrating an attenuation characteristic around the attenuation pole. As illustrated in FIG. 9A, at least one series resonator S3a out of the series resonators S1 through S4 is made to have a resonance characteristic different from those of the series resonators of the comparative example in the filter of the first embodiment. In the same manner, at least one parallel resonator P3a out of the parallel resonators P1 through P4 is made to have a resonance characteristic different from those of the parallel resonators of the comparative example. Other configurations are the same as those of the first comparative example in FIG. 8A, and a description is omitted.

In FIG. 9B, a dotted line indicates the attenuation pole 10 formed by parallel connection of the inductor L1 (first inductor) to the series resonator S1. A solid line and a dashed line indicate a pass characteristic of the series resonator S3a and a pass characteristic of the parallel resonator P3a respectively. A resonance frequency frs3 and anti-resonance frequency fas3 of the series resonator S3a are set to be located at frequencies lower than and close to a frequency fg of the attenuation pole 10. On the other hand, a resonance frequency frp3 and anti-resonance frequency fap3 of the parallel resonator P3a are set to be located at frequencies higher than and close to the frequency fg of the attenuation pole 10. This forms attenuation poles at the anti-resonance frequency fas3 and at the resonance frequency frp3. The attenuation characteristic of the filter is obtained by synthesizing waveforms of the dotted line, the solid line and the dashed line. Therefore, the attenuation between the anti-resonance frequency fas3 and the resonance frequency frp3 becomes large.

Figure 10A:
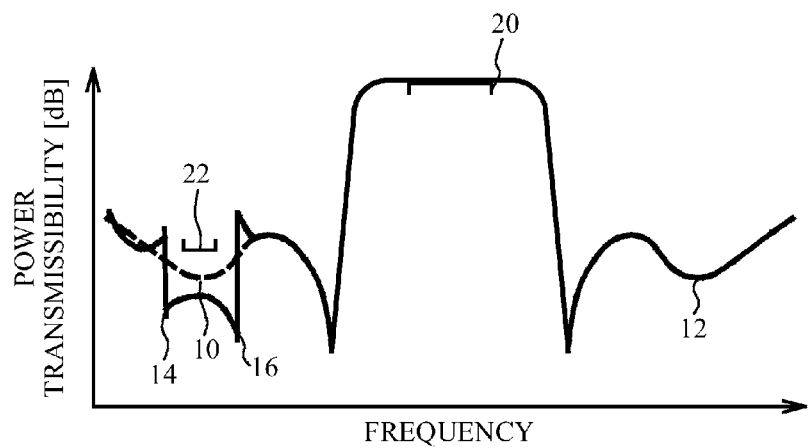
FIG. 10A is a schematic view illustrating a pass characteristic of the filter of the first embodiment.

FIG. 10A is a schematic view illustrating a pass characteristic of the filter in accordance with the first embodiment. In FIG. 10A, a dashed line indicates the pass characteristic of the filter of the first comparative example. In the first embodiment, an attenuation pole 14 (third attenuation pole) formed by an anti-resonant response of the series resonator S3a is formed at a frequency lower than that of the attenuation pole 10 (first attenuation pole), an attenuation pole 16 (second attenuation pole) formed by a resonant response of the parallel resonator P3a is formed at a frequency higher than that of the attenuation pole 10, sharp inflection points are produced at the attenuation pole 14 and the attenuation pole 16, and the attenuation characteristic has a well shape between the attenuation pole 14 and the attenuation pole 16. Therefore, achieved is the attenuation characteristic having a sufficient margin against the attenuation specification 22.

Figure 10B:
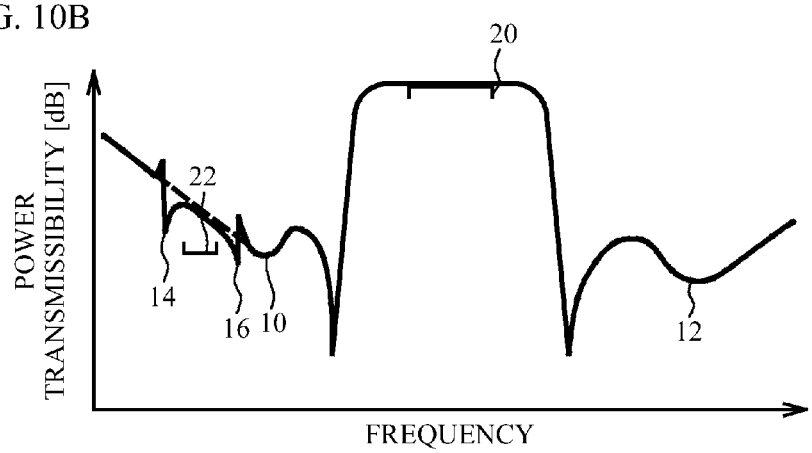
FIG. 10B is a schematic view illustrating a pass characteristic of a filter in accordance with a second comparative example.

FIG. 10B is a schematic view illustrating a pass characteristic of a filter in accordance with a second comparative example. As illustrated in FIG. 10B, the attenuation poles 14 and 16 are formed at frequencies lower than that of the attenuation pole 10 in the second comparative example. In this case, although the attenuation is large around the attenuation poles 14 and 16, the attenuation is not large between the attenuation pole 14 and the attenuation pole 16. Thus, the specification 22 is not satisfied. As described above, it is required that the attenuation pole 14 is formed at a frequency lower than that of the attenuation pole 10, and the attenuation pole 16 is formed at a frequency higher than that of the attenuation pole 10.

Figure 11A:
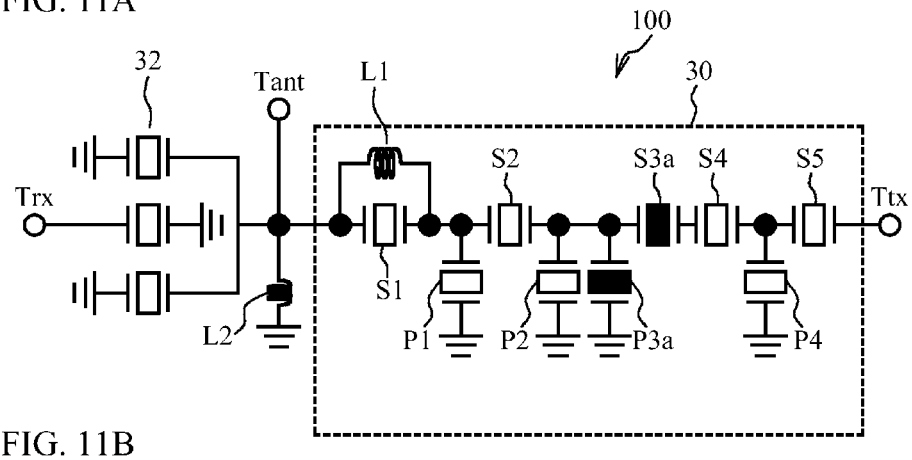
FIG. 11A is a circuit diagram of a duplexer used in a simulation of the first embodiment.
Figure 11B:
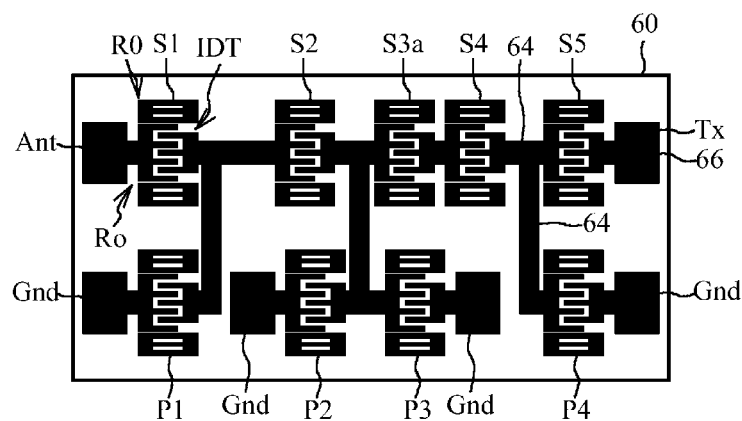
FIG. 11B is a top view of a chip that forms a transmission filter.
Figure 11C:
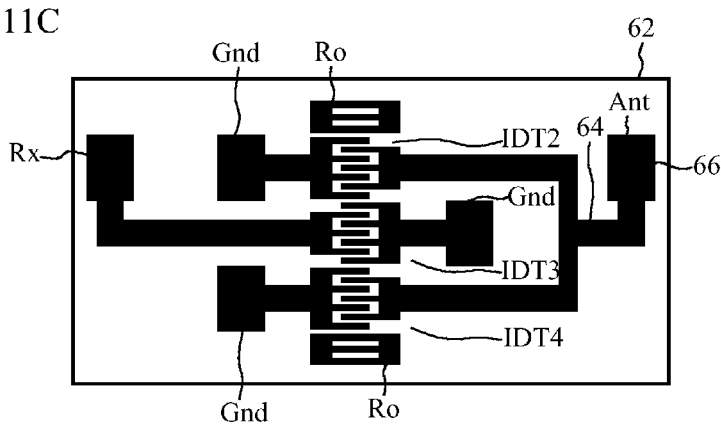
FIG. 11C is a top view of a chip that forms a reception filter.

A description will now be given of simulation results of a duplexer using the first embodiment. FIG. 11A is a circuit diagram of a duplexer used in a simulation of the first embodiment, FIG. 11B is a top view of a chip that forms a transmission filter, and FIG. 11C is a top view of a chip that forms a reception filter. Referring to FIG. 11A, a duplexer 100 is for Band 1 of WCDMA (Wide-band Code Division Multiple Access), and includes a transmission filter 30 and a reception filter 32. A frequency band that needs an attenuation region is a band for GPS (Global Positioning System). The transmission filter 30 is a ladder-type filter, and is connected between a common terminal Tant and a transmission terminal Ttx. The reception filter 32 is a multimode type filter, and is connected between the common terminal Tant and a reception terminal Trx. Series resonators S1 through S5 are connected in series between the common terminal Tant and the transmission terminal Ttx, and the parallel resonators P1 through P4 are connected in parallel between the common terminal Tant and the transmission terminal Ttx in the transmission filter 30. The inductor L1 is connected in parallel to the series resonator S1. The series resonator S3a has a resonance frequency of 1485 MHz, and forms the attenuation pole 14. The parallel resonator P3a has a resonance frequency of 1630 MHz, and forms the attenuation pole 16. Other series resonators and parallel resonators have resonance characteristics for forming the passband. The inductance of the inductor L1 is 2.8 nH. An inductor L2 is electrically connected between the common terminal Tant and a ground. The inductor L2 functions as a matching circuit.

As illustrated in FIG. 11B, a metal film made of Al or the like is formed on an LT substrate 60. The metal film forms the series resonators S1 through S5, the parallel resonators P1 through P4, wirings 64, and a pad 66. Each resonator is a surface acoustic wave resonator, and includes an IDT and the reflectors R0 formed at both sides of the IDT. The series resonators S1 through S5 are electrically connected in series between a common pad Ant and a transmission pad Tx by the wirings 64. The parallel resonators P1 through P4 are electrically connected between ground pads Gnd and nodes between the series resonators by the wirings 64.

As illustrated in FIG. 11C, a metal film made of Al or the like is formed on the LT substrate 60. The metal film forms an IDT2 through an IDT4, the wirings 64 and the pad 66. The IDT2 through the IDT4 are aligned in a propagation direction of acoustic waves between the reflectors R0. The IDT3 is electrically connected between a reception pad Rx and the ground pad Gnd. The IDT2 is connected between the common pad Ant and the ground pad Gnd, and the IDT4 is connected between the common pad Ant and the other ground pad Gnd.

Figure 12A:
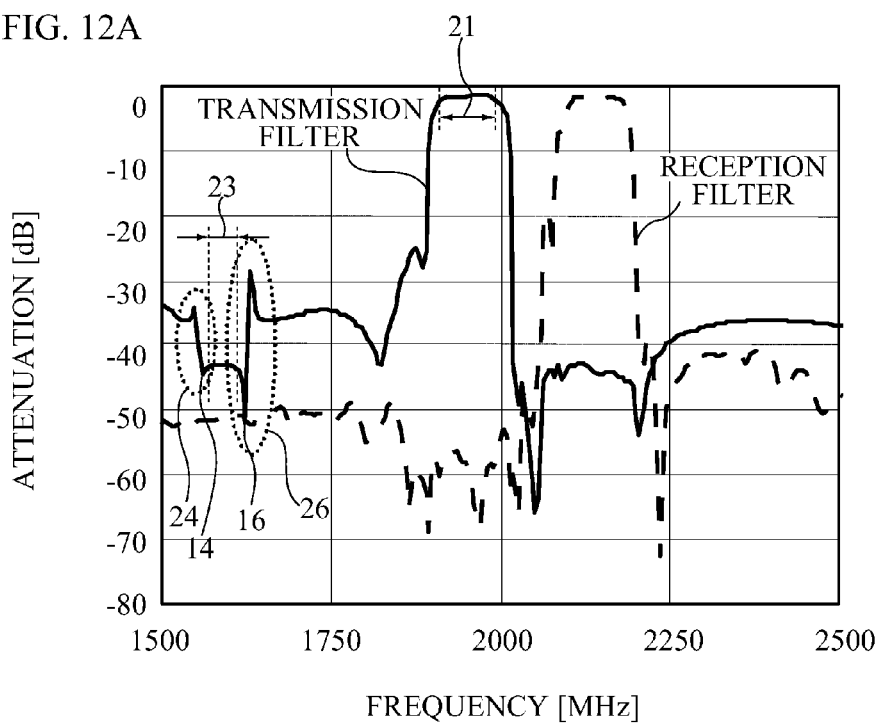
FIG. 12A is a diagram illustrating simulation results of a pass characteristic of a duplexer in accordance with the first embodiment.

FIG. 12A is a diagram illustrating simulation results of the pass characteristic of the duplexer of the first embodiment. A dashed line indicates a pass characteristic of the reception filter 32, and a solid line indicates a pass characteristic of the transmission filter 30 in FIG. 12A. A band 21 is a transmission band of Band 1 of WCDMA, and a band 23 is a GPS frequency band. A response 24 by the series resonator S3a and a response 26 by the parallel resonator P3a appear in the pass characteristic of the transmission filter 30, and a well-shaped attenuation region is formed between the attenuation poles 14 and 16 so as to include the band 23.

Figure 12B:
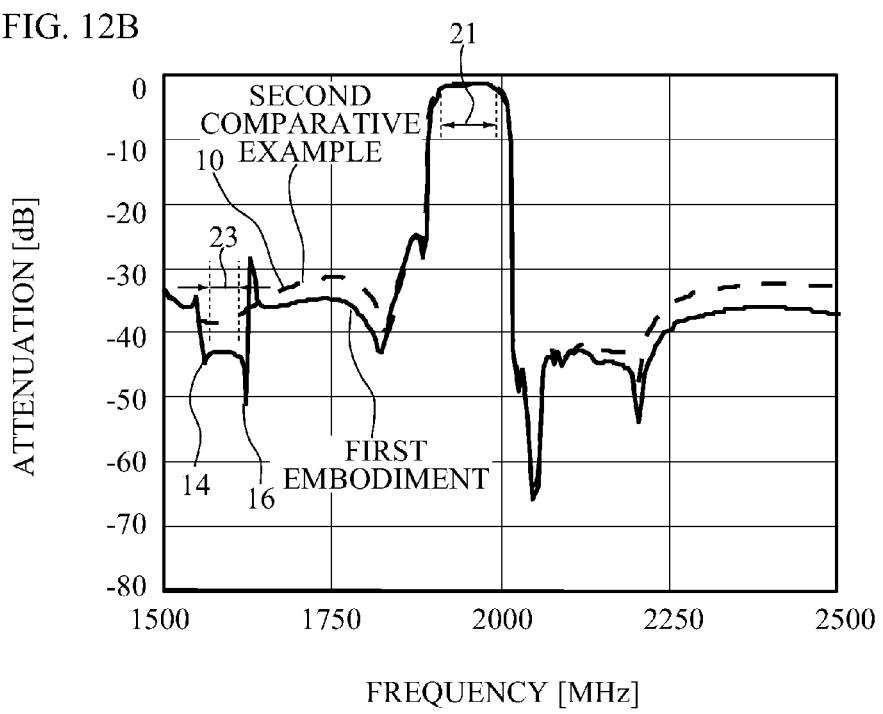
FIG. 12B is a diagram illustrating simulation results of pass characteristics of the transmission filters of the first embodiment and the second comparative example.

FIG. 12B is a diagram illustrating simulation results of pass characteristics of the transmission filters of the first embodiment and the second comparative example. The second comparative example does not form the series resonator S3a or the parallel resonator P3a. The attenuation pole 10 resulting from the inductor L1 is formed in the second comparative example. On the other hand, the well-shaped attenuation region is formed by the attenuation poles 10, 14 and 16 in the first embodiment. This allows the first embodiment to make the attenuation within the band 23 large.

Figure 13A:
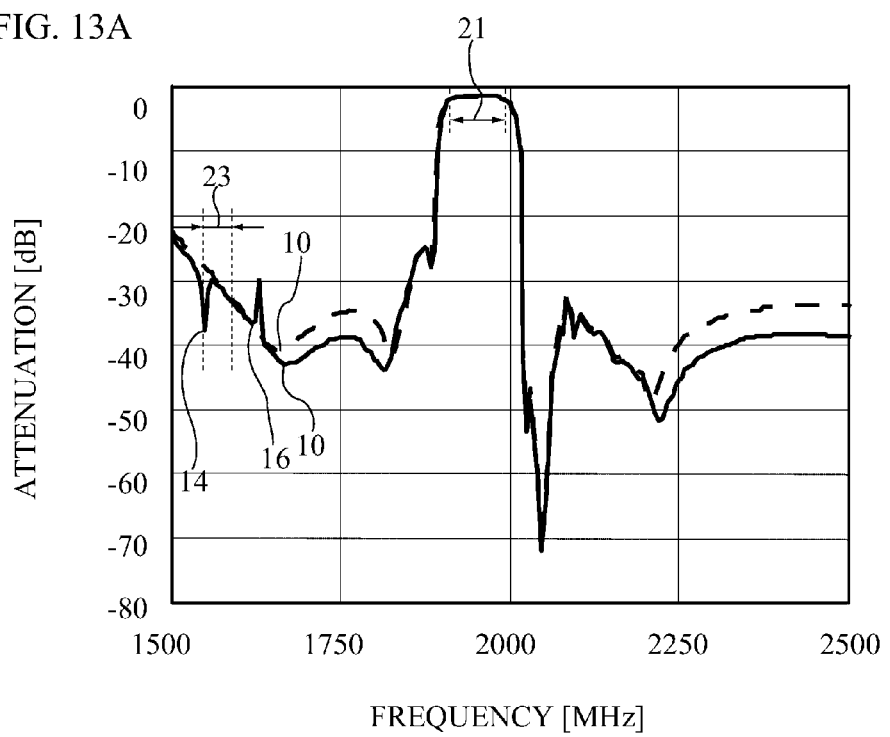
FIG. 13A and FIG. 13B are diagrams illustrating simulation results of a pass characteristic of a transmission filter when an attenuation pole 10 is not located between attenuation poles 14 and 16.
Figure 13B:
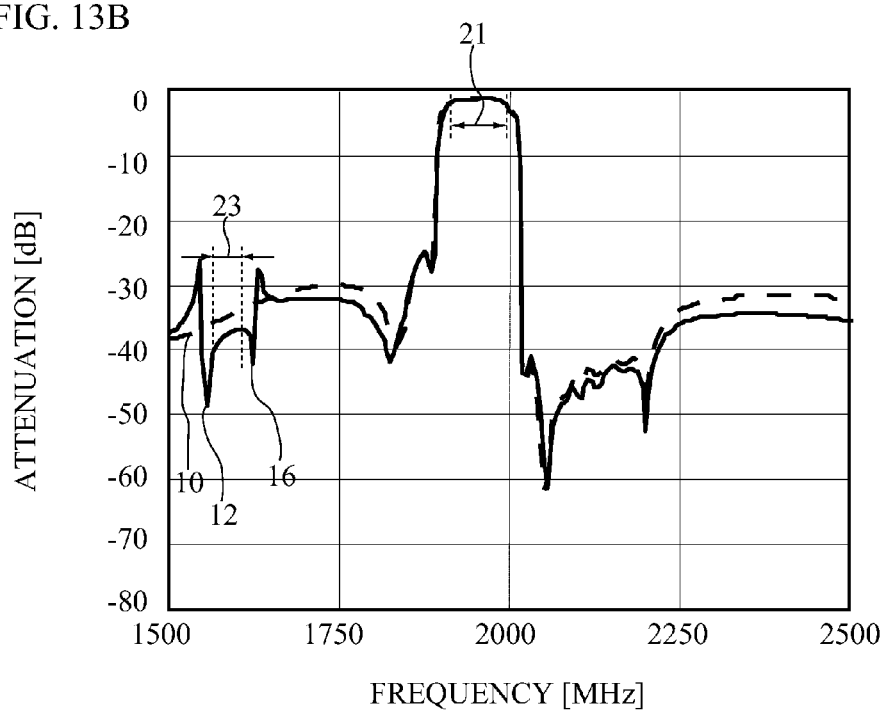

FIG. 13A and FIG. 13B are diagrams illustrating simulation results of the pass characteristic of the transmission filter when the attenuation pole 10 is not located between the attenuation poles 14 and 16. A dashed line indicates a transmission filter including neither the series resonator S3$a$ nor the parallel resonator P3$a$, and a solid line indicates the transmission filter including the series resonator S3$a$ and the parallel resonator P3$a$. In FIG. 13A, the attenuation poles 14 and 16 are located at frequencies lower than that of the attenuation pole 10. In this case, the well-shaped attenuation region is not formed, and the attenuation within the band 23 is small. In FIG. 13B, the attenuation poles 14 and 16 are located at frequencies higher than that of the attenuation pole 10. In this case, the attenuation within the band 23 is small. As described above, the attenuation pole 10 is required to be located between the attenuation poles 14 and 16.

In the first embodiment, the S3$a$, which is a part of the series resonators S1 through S4, has the resonance frequency frs3 and the anti-resonance frequency fas3 that are located outside the passband and at frequencies lower than that of the attenuation pole 10. On the other hand, the P3$a$, which is a part of the parallel resonators P1 through P4, has the resonance frequency frp3 and the anti-resonance frequency fap3 that are located outside the passband and at frequencies higher than that of the attenuation pole 10. This enables to make the attenuation around the attenuation pole 10 large as illustrated in FIG. 10A.

The attenuation region is formed so that skirts of the attenuation pole 10, the attenuation pole 14 and the attenuation pole 16 overlap each other. The attenuation region is formed so as to have a well shape for example. For example, the series resonator S3$a$ makes the attenuation large, and the parallel resonator P3$a$ makes the attenuation further large at the frequency fg of the attenuation pole 10. This enables to make the margin of the attenuation against the specification 22 large.

The inductor L1 may be connected in parallel to at least one of the series resonators, or may be connected in parallel to the single series resonator S1 as described in the first embodiment. The inductor L1 may be connected in parallel to the series resonator other than the series resonator S1. The series resonator forming the attenuation pole 14 may be a part of the series resonators, or may be the single series resonator S3$a$ as described in the first embodiment. In addition, the series resonator forming the attenuation pole 14 may be the series resonator other than the series resonator S3$a$. Furthermore, the parallel resonator forming the attenuation pole 16 may be a part of the parallel resonators, or may be the single parallel resonator P3$a$ as described in the first embodiment. In addition, the parallel resonator forming the attenuation pole 16 may be the parallel resonator other than the parallel resonator P3$a$.

The attenuation pole 12 at a frequency higher than the passband may be an attenuation pole forming the attenuation poles 14 and 16. However, it is difficult to make the attenuation large at the attenuation pole 10 located at a frequency lower than the passband using other methods compared to at the attenuation pole 12. Therefore, the attenuation poles 14 and 16 are preferably formed around the attenuation pole 10 located at a frequency lower than the passband.

Second Embodiment

Figure 14:
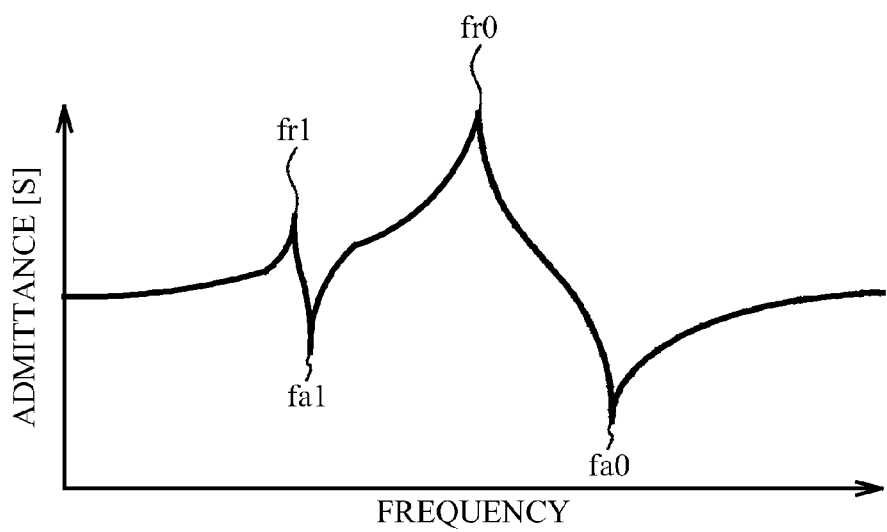
FIG. 14 is a schematic view illustrating an admittance characteristic of a resonator having a secondary resonance.

A second embodiment uses a secondary resonance of the parallel resonator P3$a$. FIG. 14 is a schematic view illustrating an admittance characteristic of a resonator having a secondary resonance. Compared to FIG. 4, a resonance frequency fr1 and anti-resonance frequency fa1 of the secondary resonance are formed at frequencies lower than the resonance frequency fr0 and anti-resonance frequency fa0 of a primary resonance respectively. The secondary resonance is an unnecessary response to the primary resonance for example. The surface acoustic wave resonator can produce the secondary resonance by reducing the number of pairs or shortening a length of aperture for example. The piezoelectric thin film resonator can produce the secondary resonance by reducing the area of the resonance region for example. The second embodiment uses a resonator having the secondary resonance for the parallel resonator P3$a$ in FIG. 9A of the first embodiment. Other configurations are the same as those of the first embodiment, and a description is omitted.

Figure 15A:
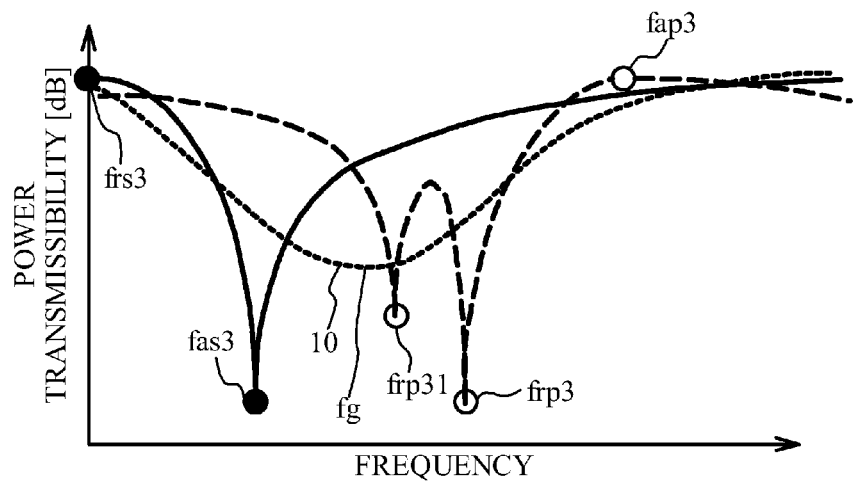
FIG. 15A is a schematic view illustrating an attenuation characteristic around the attenuation pole of a filter in accordance with a second embodiment.

FIG. 15A is a schematic view illustrating an attenuation characteristic around the attenuation pole of the filter in accordance with the second embodiment. As illustrated in FIG. 15A, the attenuation pole having the resonance frequency frp31 resulting from the secondary resonance is formed around the frequency fg of the attenuation pole 10 as compared to FIG. 9B of the first embodiment.

Figure 15B:
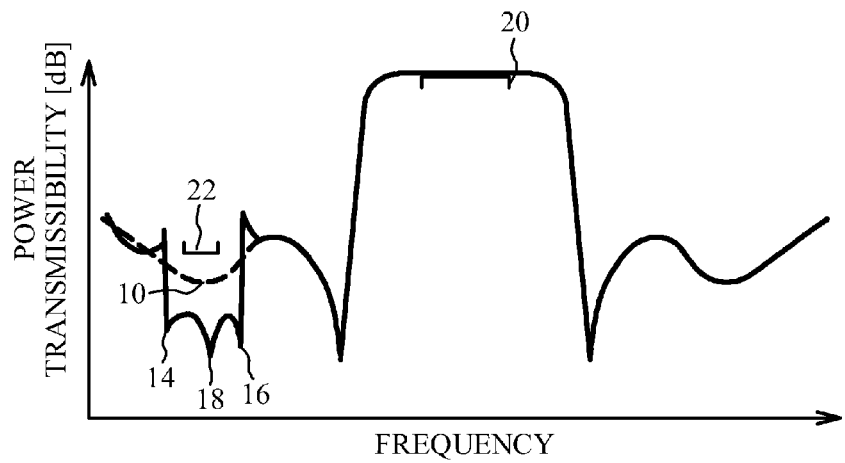
FIG. 15B is a schematic view illustrating a pass characteristic of the filter of the second embodiment.

FIG. 15B is a schematic view illustrating a pass characteristic of the filter of the second embodiment. A dashed line indicates the pass characteristic of the filter of the first comparative example in FIG. 15B. As illustrated in FIG. 15B, an attenuation pole 18 resulting from the secondary resonance is formed between the attenuation poles 14 and 16. This makes the margin of the attenuation characteristic against the specification 22 further large.

A description will now be given of simulation results of a duplexer using the second embodiment. The duplexer used in the simulation has the same configuration as the one illustrated in FIG. 11A through FIG. 11C of the first embodiment except that the parallel resonator P3$a$ has a resonance frequency of the secondary resonance at 1595 MHz.

Figure 16:
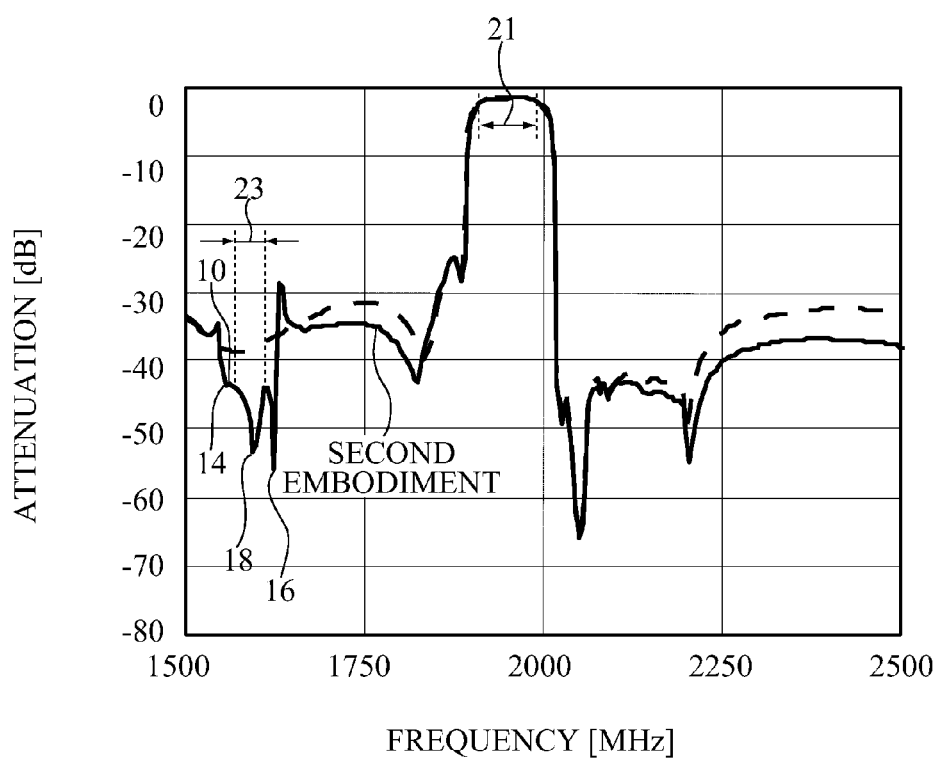
FIG. 16 is a diagram illustrating simulation results of a pass characteristic of a transmission filter in a duplexer in accordance with the second embodiment.

FIG. 16 is a diagram illustrating simulation results of a pass characteristic of a transmission filter in the duplexer of the second embodiment. A solid line indicates the pass characteristic of the transmission filter of the second embodiment, and a dashed line indicates the pass characteristic of the transmission filter including neither the series resonator S3$a$ nor the parallel resonator P3$a$ in FIG. 16. As illustrated in FIG. 16, the attenuation pole 18 is formed between the attenuation poles 14 and 16. This makes the attenuation in the attenuation region large.

The second embodiment has the resonance frequency frp31 of the secondary resonance at a frequency lower than the resonance frequency frp of the parallel resonator P3$a$. This enables to make the attenuation in the attenuation region large as illustrated in FIG. 15B. When a plurality of parallel resonators P3$a$ form the attenuation pole 16, it is sufficient if at least one of the parallel resonators P3$a$ has the resonance frequency of the secondary resonance.

The resonance frequency frp31 of the secondary resonance is preferably located at a frequency higher than the anti-resonance frequency fas3 of the series resonator S3$a$. This enables to form the attenuation pole 18 between the attenuation poles 14 and 16.

Third Embodiment

Figure 17A:
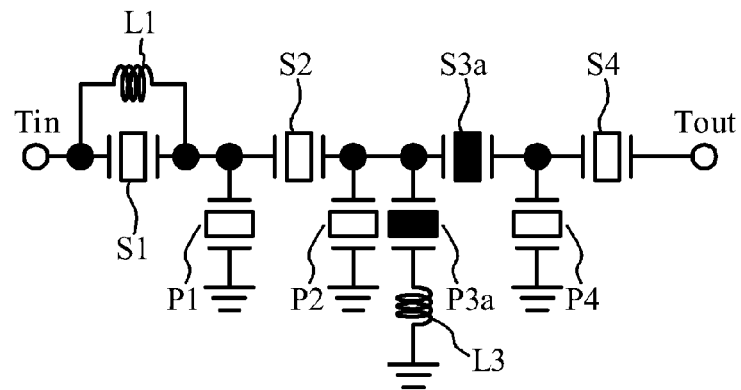
FIG. 17A is a circuit diagram of a filter in accordance with a third embodiment.
Figure 17B:
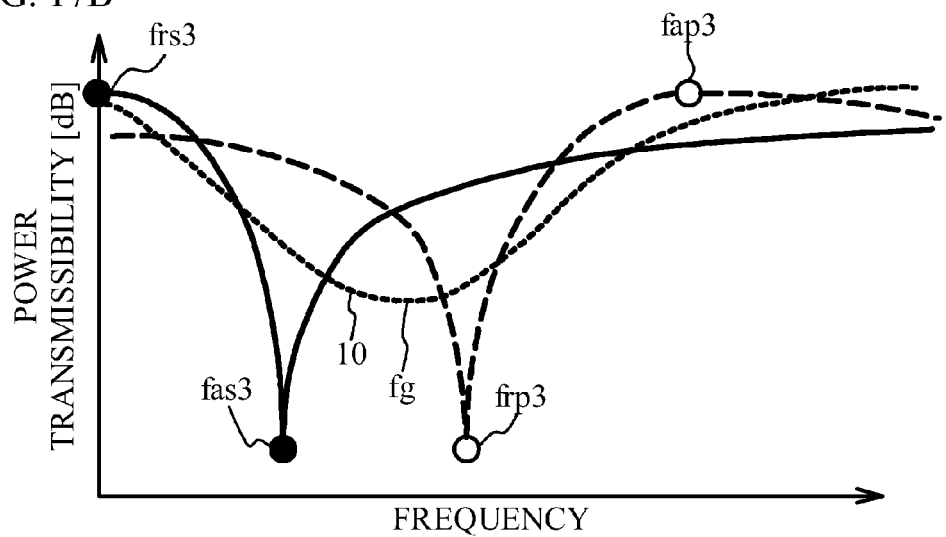
FIG. 17B is a schematic view illustrating an attenuation characteristic around the attenuation pole.

A third embodiment arranges an inductor between a parallel resonator and a ground. FIG. 17A is a circuit diagram of a filter in accordance with the third embodiment, and FIG. 17B is a schematic view illustrating an attenuation characteristic around the attenuation pole. As illustrated in FIG. 17A, an inductor L3 (second inductor) is electrically connected in series between a ground side end of the parallel resonator P3a and a ground. Other configurations are the same as those in FIG. 9A of the first embodiment, and a description is omitted. As illustrated in FIG. 17B, the inductor L3 widens an interval between the resonance frequency frp3 and the anti-resonance frequency fap3 of the parallel resonator P3a. Thus, the resonance frequency frp3 comes close to the frequency fg of the attenuation pole 10 compared to FIG. 9B.

Figure 18:
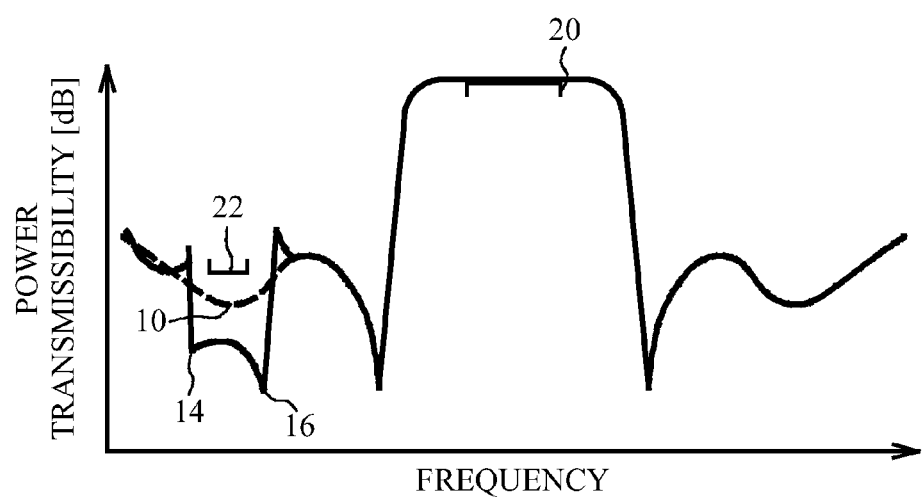
FIG. 18 is a schematic view illustrating a pass characteristic of the filter of the third embodiment.

FIG. 18 is a schematic view of a pass characteristic of the filter of the third embodiment. As illustrated in FIG. 18, the resonance frequency of the parallel resonator P3a comes close to the attenuation pole 10 due to the inductor L3, and thus it is possible to make the attenuation around the center of the well-shaped attenuation region large.

In the third embodiment, the inductor L3 is connected in series between the parallel resonator P3a and a ground. This enables to make the attenuation in the attenuation region further large. When a plurality of parallel resonators P3a form the attenuation pole 16, it is sufficient if the inductor L3 is connected between at least one of the parallel resonators P3a and a ground.

Fourth Embodiment

A fourth embodiment makes a resonant resistance of the parallel resonator high. A circuit diagram of a filter in accordance with the fourth embodiment is the same as FIG. 9A of the first embodiment, and a description is omitted. The fourth embodiment makes a resonant resistance of the parallel resonator P3a higher than those of the parallel resonators P1, P2 and P4 forming the passband. Decrease in the number of pairs of reflectors makes the resonant resistance of the resonator high in the surface acoustic wave resonator, for example. Decrease in the area of the resonance region makes a resonant resistance of the resonator high in the piezoelectric thin film resonator, for example. When the resonant resistance becomes high, a Q-value at a resonance point becomes small. This makes flyback at the resonance point small.

Figure 19:
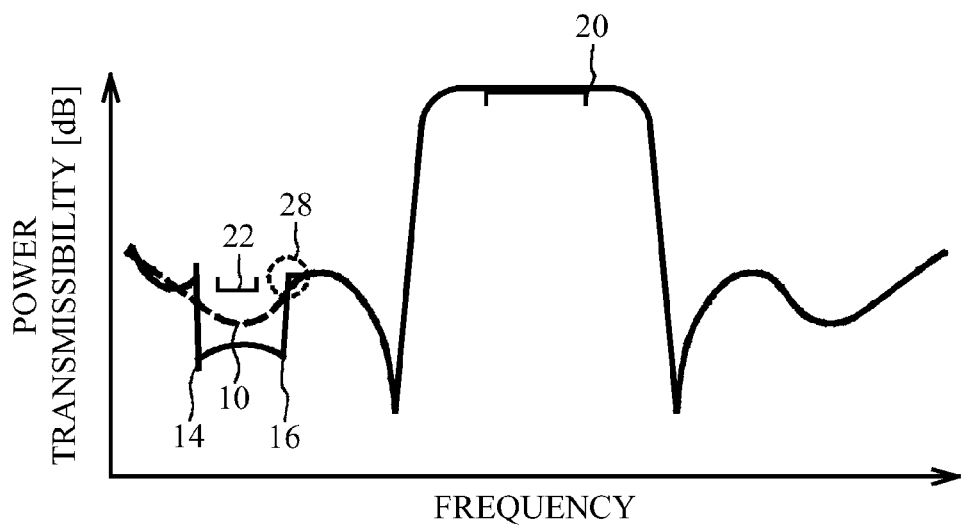
FIG. 19 is a schematic view illustrating a pass characteristic of a filter in accordance with a fourth embodiment.

FIG. 19 is a schematic view illustrating a pass characteristic of the filter in accordance with the fourth embodiment. Decrease in the attenuation is small at a frequency 28 higher than that of the attenuation pole 16 compared to FIG. 10A of the first embodiment.

Figure 20:
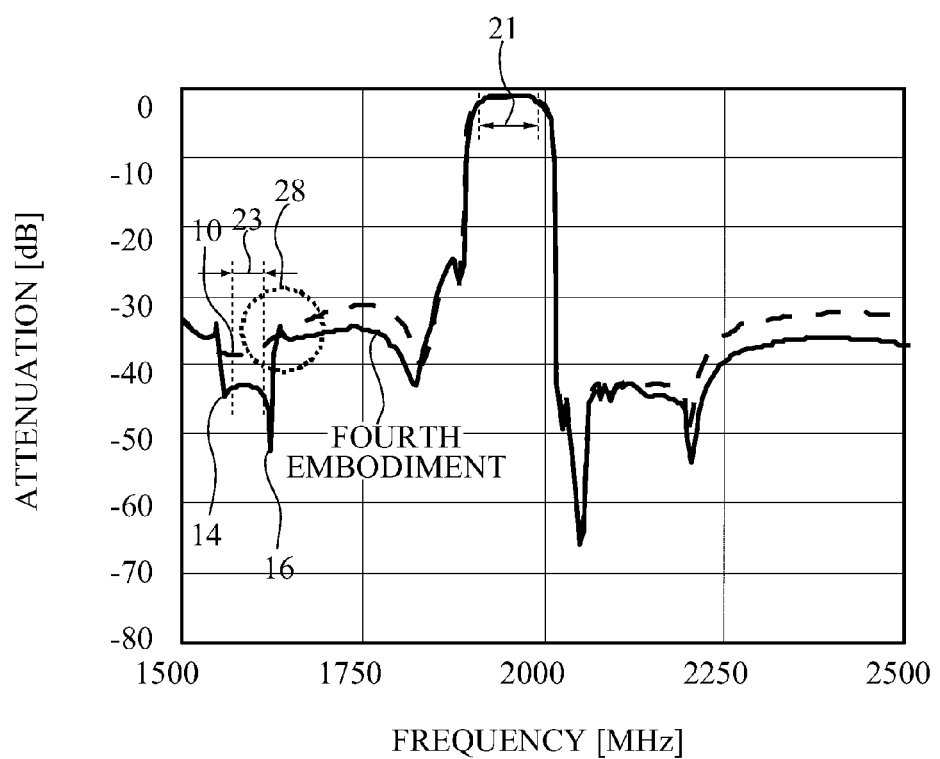
FIG. 20 is a diagram illustrating simulation results of a pass characteristic of a transmission filter in a duplexer in accordance with the fourth embodiment.

FIG. 20 is a diagram illustrating simulation results of a pass characteristic of a transmission filter in a duplexer in accordance with the fourth embodiment. The duplexer used in the simulation has the same configuration as the one illustrated in FIG. 11A through FIG. 11C of the first embodiment, and a description is omitted. A solid line indicates a pass characteristic of the transmission filter of the fourth embodiment, and a dashed line indicates the pass characteristic of the transmission filter including neither the series resonator S3a nor the parallel resonator P3a in FIG. 20. As illustrated in FIG. 20, the flyback at the frequency 28 higher than that of the attenuation pole 16 is small compared to FIG. 10A.

The parallel resonator P3a has a resonant resistance higher than those of other parallel resonators in the fourth embodiment. This enables to make the flyback at the resonance point small. When a plurality of parallel resonators P3a form the attenuation pole 16, it is sufficient if at least one of the parallel resonators P3a has a resonant resistance higher than that of the parallel resonator forming the passband. It is also possible to reduce the flyback at a frequency lower than that of the attenuation pole 14 by making the resonant resistance of the series resonator S3a higher than those of other series resonators. That is to say, it is preferable that at least one of the P3a and the S3a has a resonant resistance higher than that of the resonator forming the passband, where the P3a is a part of the parallel resonators, and the S3a is a part of the series resonators.

Figure 21:
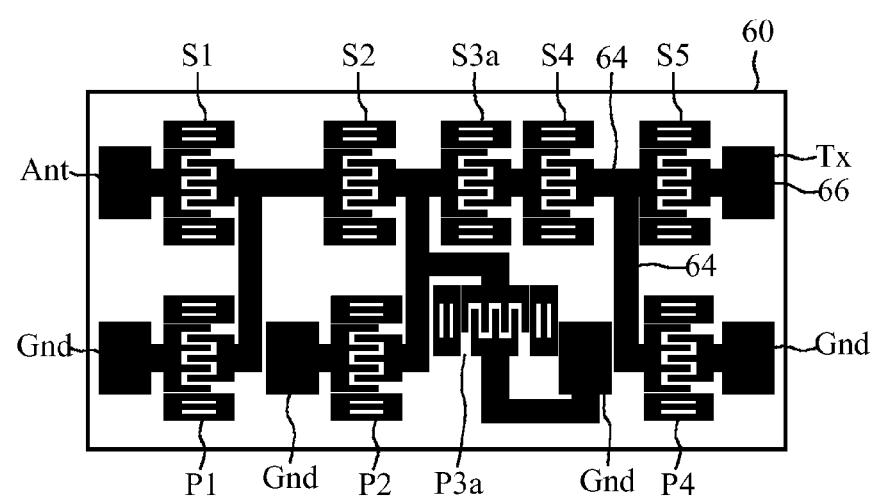
FIG. 21 is a top view of a chip that forms a transmission filter.

FIG. 21 is a top view of a chip that forms a transmission filter when the surface acoustic wave resonator is used. A propagation direction of acoustic waves in the parallel resonator P3 is different from a propagation direction of acoustic waves in the resonator forming the passband in FIG. 21 Other configurations are the same as those in FIG. 11B, and a description is omitted. As described above, at least one of the series resonator S3a and the parallel resonator P3a may have a propagation direction of acoustic waves different from that of the resonator forming the passband. This enables to make a resonant resistance high, and to suppress flyback. In addition, it is possible to use an acoustic wave having an acoustic velocity and coupling coefficient different from those of the resonator forming the passband. Thus, the flexibility in designing the attenuation characteristic increases.

Fifth Embodiment

Figure 22A:
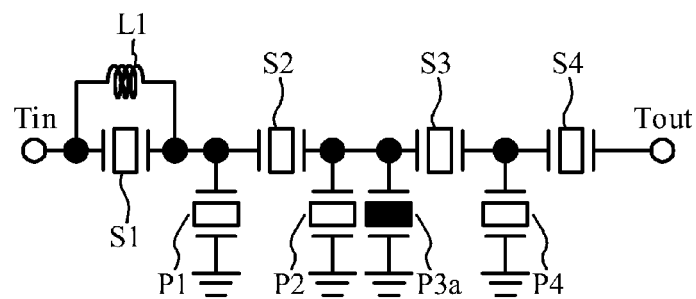
FIG. 22A is a circuit diagram of a filter in accordance with a fifth embodiment.
Figure 22B:
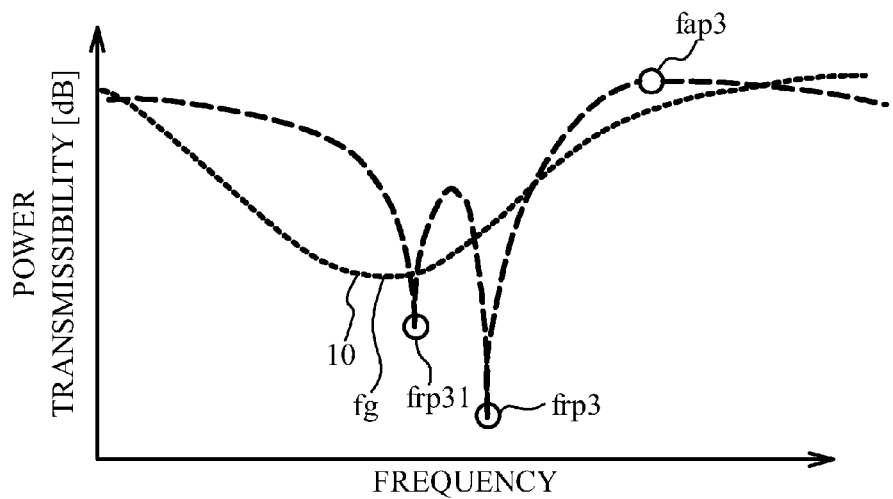
FIG. 22B is a schematic view illustrating an attenuation characteristic around the attenuation pole.

A fifth embodiment uses a secondary resonance of the parallel resonator. FIG. 22A is a circuit diagram of a filter in accordance with the fifth embodiment, and FIG. 22B is a schematic view illustrating an attenuation characteristic around the attenuation pole. Referring to FIG. 22A, the parallel resonator P3a is a resonator having a secondary resonance as with the second embodiment. On the other hand, the series resonator S3 is a resonator forming the passband. Other configurations are the same as those in FIG. 9A of the first embodiment, and a description is omitted. As illustrated in FIG. 22B, the resonance frequency frp3 of the parallel resonator P3a is located at a frequency higher than that of the attenuation pole 10. Furthermore, the resonance frequency frp31 of the secondary resonance of the parallel resonator P3a is located at a frequency lower than the resonance frequency frp3. The attenuation pole resulting from the series resonator is not formed unlike FIG. 15A of the second embodiment.

Figure 23:
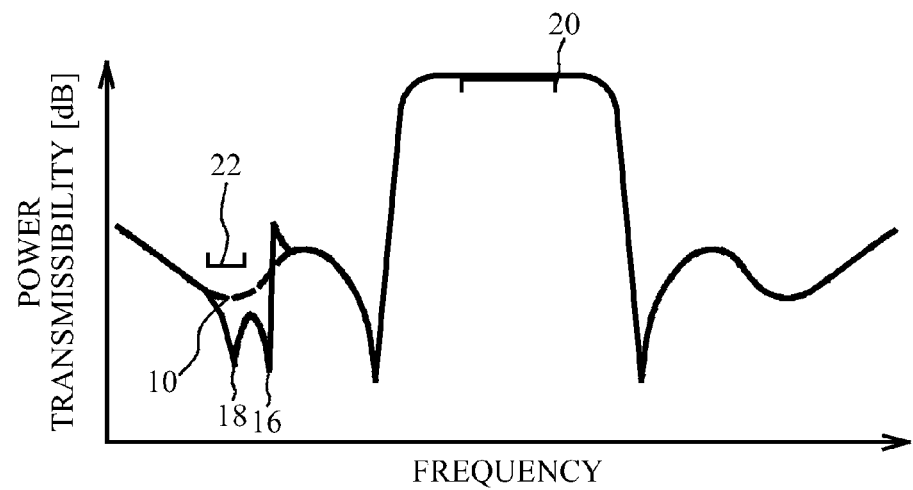
FIG. 23 is a schematic view illustrating a pass characteristic of the filter of the fifth embodiment.

FIG. 23 is a schematic view illustrating a pass characteristic of the filter of the fifth embodiment. A dashed line indicates the pass characteristic of the filter of the first comparative example in FIG. 23. As illustrated in FIG. 23, the attenuation pole 18 (third attenuation pole) formed by the secondary resonant response is formed so as to overlap with the attenuation poles 10 and 16. This enables to make the margin of the attenuation characteristic against the specification 22 further large.

A description will now be given of simulation results of a duplexer using the fifth embodiment. The duplexer used in the simulation has the same configuration as the one illustrated in FIG. 11A through FIG. 11C of the first embodiment except that the parallel resonator P3a has a resonance frequency of the secondary resonance at 1595 MHz, and the duplexer does not include the series resonator S3a.

Figure 24:
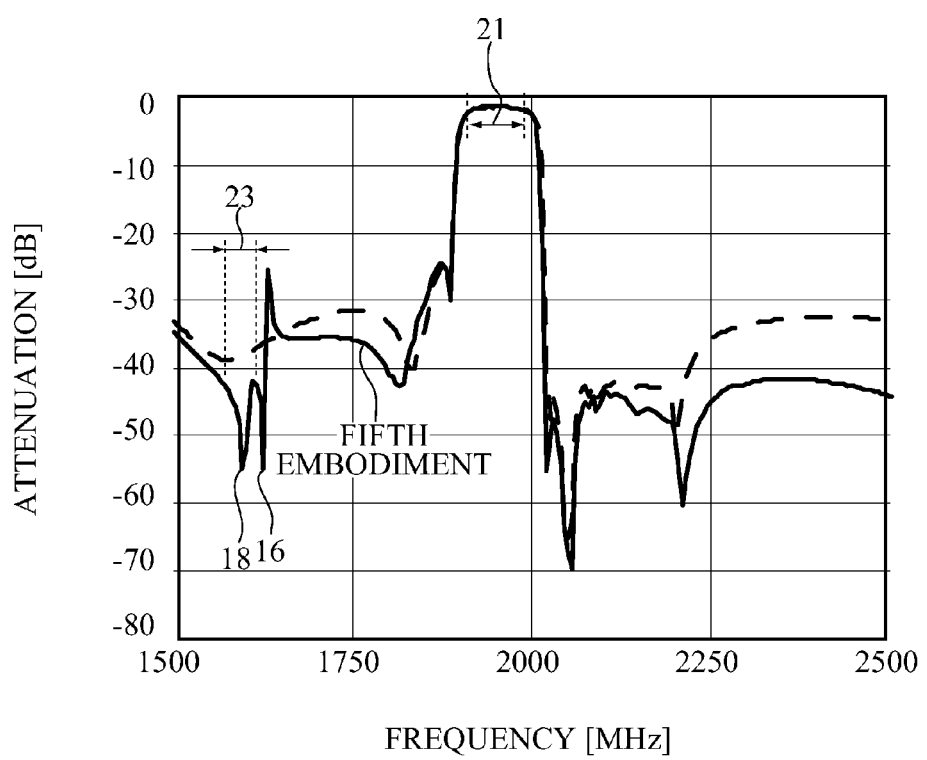
FIG. 24 is a diagram illustrating simulation results of a pass characteristic of a transmission filter in a duplexer in accordance with the fifth embodiment.

FIG. 24 is a diagram illustrating simulation results of a pass characteristic of a transmission filter in the duplexer in accordance with the fifth embodiment. A solid line indicates the pass characteristic of the transmission filter of the fifth embodiment, and a dashed line indicates a pass characteristic of the transmission filter including neither the series resonator S3a nor the parallel resonator P3a in FIG. 25. As illustrated in FIG. 24, the attenuation pole 18 is formed so as to overlap with the attenuation pole 10. This makes the attenuation in the attenuation region large.

As described in the fifth embodiment, the series resonator S3a may not be provided, and the parallel resonator P3a may have a resonance frequency of the secondary resonance at a frequency lower than the resonance frequency. This enables to improve the attenuation characteristic even if the resonator S3a is not directly provided unlike the second embodiment. When a plurality of parallel resonators P3a form the attenuation pole 16, it is sufficient if at least one of the parallel resonators P3a has the resonance frequency of the secondary resonance.

Furthermore, it is preferable that the attenuation region is formed so that skirts of the attenuation pole 10, attenuation pole 16 and attenuation pole 18 overlap each other. This enables to make the attenuation in the attenuation region further large.

The resonance frequency frp31 may be located at a frequency lower or higher than the frequency fg of the attenuation pole 10. However, it is preferable that the resonance frequency frp31 of the secondary resonance is located at a frequency lower than the frequency fg of the attenuation pole 10 in order to make the attenuation poles 10, 16 and 18 overlap each other and make the attenuation in the attenuation region further large.

Furthermore, the parallel resonator forming the attenuation pole 16 may be a part of the parallel resonators, or may be the single parallel resonator P3a as described in the fifth embodiment. When a plurality of parallel resonators form the attenuation pole 16, it is sufficient if at least one of the parallel resonators has a secondary resonance.

As described in the third embodiment, the inductor L3, which is connected in series between the parallel resonator P3a and a ground, may be provided. As described in the fourth embodiment, the parallel resonator P3a may have a resonant resistance higher than those of other parallel resonators.

As illustrated in FIG. 21, the propagation direction of acoustic waves in the parallel resonator P3a may be different from that in the resonator forming the passband.

The surface acoustic wave resonator illustrated in FIG. 1A through FIG. 2B may be used as the resonator in the first through fifths embodiments. Moreover, the piezoelectric thin film resonator illustrated in FIG. 3A and FIG. 3B may be used.

The filters in accordance with the first through fifth embodiments may be used in a duplexer. For example, at least one of a reception filter and a transmission filter may be any one of the filters of the first through fifths embodiments in a duplexer in which the transmission filter is connected between a transmission terminal and a common terminal, and the reception filter is connected between a reception terminal and the common terminal. Furthermore, a communication high-frequency module for mobile communication may use any one of the filters of the first through fifth embodiments.

Although the embodiments of the present invention have been described in detail, it is to be understood that the various change, substitutions, and alterations could be made hereto without departing from the spirit and scope of the invention.

What is claimed is:

1. A filter comprising:
   first series resonators that are connected in series between an input terminal and an output terminal;
   first parallel resonators that are connected in parallel between the input terminal and the output terminal, the first series resonators and the first parallel resonators forming a ladder-type filter;
   a first inductor that is connected in parallel to at least one first series resonator;
   one or more second parallel resonators that are provided separately from the first parallel resonators, are connected between the input terminal and the output terminal, and have a resonance frequency and an anti-resonance frequency at frequencies lower than a passband formed by the first series resonators and the first parallel resonators; wherein
   a unit of an attenuation region is formed by a first attenuation pole, a second attenuation pole, and a third attenuation pole, the first attenuation pole is formed by the at least one first series resonator and the first inductor, the second attenuation pole is formed by a resonant response of the one or more second parallel resonators, and the third attenuation pole is formed by a secondary resonant response of the one or more second parallel resonators,
   wherein each of the first series resonators and the first parallel resonators includes an IDT and reflectors arranged at both sides of the IDT.

2. The filter according to claim 1, wherein
   the one or more second parallel resonators have the resonance frequency and the anti-resonance frequency at frequencies higher than a frequency of the first attenuation pole.

3. A duplexer comprising:
   a reception filter; and
   a transmission filter, wherein
   at least one of the reception filter and the transmission filter is the filter according to claim 1.

4. The filter according to claim 1, wherein
   a resonance frequency of the secondary resonant response of the one or more second parallel resonators is located at a frequency lower than the resonance frequency of the one or more second parallel resonators.

5. The filter according to claim 1, wherein
   the at least one first series resonator is a single series resonator, and
   the one or more second parallel resonators are a single parallel resonator.

6. The filter according to claim 1, further comprising:
   a second inductor that is connected in series between at least one of the one or more second parallel resonators and a ground.

7. The filter according to claim 1, wherein
   at least one of the one or more second parallel resonators has a resonant resistance higher than resonant resistances of the first parallel resonators.

8. The filter according to claim 1, wherein
   the first parallel resonators and the one or more second parallel resonators are surface acoustic wave resonators, and
   at least one of the one or more second parallel resonators has a propagation direction of acoustic waves different from those of the first parallel resonators.

9. The filter according to 1, wherein
   the first series resonators and the first parallel resonators are surface acoustic wave resonators.

10. The filter according to claim 1, wherein
    the first series resonators and the first parallel resonators are piezoelectric thin film resonators.

11. A filter comprising:
    first series resonators that are connected in series between an input terminal and an output terminal;
    first parallel resonators that are connected in parallel between the input terminal and the output terminal, the first series resonators and the first parallel resonators forming a ladder-type filter;
    a first inductor that is connected in parallel to at least one first series resonator;

one or more second parallel resonators that are provided separately from the first parallel resonators, are connected between the input terminal and the output terminal, and have a resonance frequency and an anti-resonance frequency at frequencies lower than a passband formed by the first series resonators and the first parallel resonators;

a second series resonator that is provided separately from the first series resonators, is connected in series between the input terminal and the output terminal, and has a resonance frequency and an anti-resonance frequency at a frequency lower than a passband formed by the first series resonators and the first parallel resonators, wherein a unit of the attenuation region is formed by a first attenuation pole, a second attenuation pole, and a third attenuation pole, the first attenuation pole is formed by the at least one first series resonator and the first inductor, the second attenuation pole is formed by a resonant response of the one or more second parallel resonators, and the third attenuation pole is formed by an anti-resonant response of the second series resonator, wherein each of the first series resonators and the first parallel resonators includes an IDT and reflectors arranged at both sides of the IDT.

12. The filter according to claim 11, wherein at least one of the one or more second parallel resonators has a resonance frequency of a secondary resonance at a frequency lower than the resonance frequency.

13. The filter according to claim 11, wherein at least one of the one or more second parallel resonators has a resonance frequency of a secondary resonance at a frequency lower than the resonance frequency, and the resonance frequency of the secondary resonance is located at a frequency higher than the anti-resonance frequency of the second series resonator.

14. The filter according to claim 11, further comprising: at least one of the one or more second parallel resonators and the second series resonator has a resonant resistance higher than that of a resonator forming the passband.

15. The filter according to claim 11, wherein the first series resonators, the first parallel resonators, the one or more second parallel resonators, and the second series resonator are surface acoustic wave resonators, and at least one of the one or more second parallel resonators and the second series resonator has a propagation direction of acoustic waves different from that of a resonator forming the passband.

16. The filter according to claim 11, wherein the second series resonator has the resonance frequency and the anti-resonance frequency at frequencies lower than a frequency of the first attenuation pole.

17. The filter according to claim 11, wherein the at least one first series resonator is a single series resonator, the second series resonator is a single series resonator, and the one or more second parallel resonators are a single parallel resonator.

18. The filter according to claim 11, wherein the third attenuation pole is formed at a frequency lower than that of the first attenuation pole, and the second attenuation pole is formed at a frequency higher than that of the first attenuation pole.

* * * * *